United States Patent
Neidich et al.

(10) Patent No.: US 6,290,507 B1
(45) Date of Patent: *Sep. 18, 2001

(54) INTERPOSER ASSEMBLY

(75) Inventors: Douglas A. Neidich, Harrisburg; John D. Walden, Mechanicsburg, both of PA (US)

(73) Assignee: InterCon Systems, Inc., Harrisburg, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/605,572

(22) Filed: Jun. 28, 2000

Related U.S. Application Data

(63) Continuation-in-part of application No. 09/455,989, filed on Dec. 7, 1999, now Pat. No. 6,176,707, which is a continuation of application No. 09/287,896, filed on Apr. 7, 1999, now abandoned, which is a continuation-in-part of application No. 08/960,953, filed on Oct. 30, 1997, now abandoned.

(51) Int. Cl.⁷ .................................................. H01R 12/00
(52) U.S. Cl. ............................................... 439/66; 439/71
(58) Field of Search .............................. 439/66, 71, 591, 439/592, 81; 361/219, 264

(56) References Cited

U.S. PATENT DOCUMENTS

| | | | |
|---|---|---|---|
| 1,983,511 | 12/1934 | Johnson | 173/330 |
| 2,158,969 | 5/1939 | Oliver | 173/324 |

(List continued on next page.)

FOREIGN PATENT DOCUMENTS

WO 90/11629    10/1990    (WO) .

*Primary Examiner*—Renee Luebke
*Assistant Examiner*—Briggitte R. Hammond
(74) *Attorney, Agent, or Firm*—Thomas Hooker, P.C.

(57) ABSTRACT

An interposer assembly includes an insulating plate with passages extending through the thickness of the plate and projections extending into the passages. Metal contacts are loosely confined in the passages by the projections. The contacts include noses that project outwardly from the plate for engagement with contact pads on overlying and underlying circuit members.

34 Claims, 8 Drawing Sheets

U.S. PATENT DOCUMENTS

| | | | |
|---|---|---|---|
| 2,599,488 | 6/1952 | Sampson | 173/324 |
| 3,346,863 | 10/1967 | Siebold | 343/702 |
| 3,447,040 | 5/1969 | Denton, Jr. | 317/101 |
| 3,954,317 | 5/1976 | Gilissen et al. | 339/17 |
| 4,114,975 | 9/1978 | Weidler | 339/176 M |
| 4,354,729 | 10/1982 | Grabbe et al. | 339/258 R |
| 4,421,370 | 12/1983 | Treakle et al. | 339/59 M |
| 4,511,197 | 4/1985 | Grabbe et al. | 339/17 CF |
| 4,513,353 | 4/1985 | Bakermans et al. | 361/399 |
| 4,593,961 | 6/1986 | Cosmo | 339/61 M |
| 4,647,124 | 3/1987 | Kandybowski | 339/17 |
| 4,655,519 | 4/1987 | Evans et al. | 339/17 |
| 4,664,458 | 5/1987 | Worth | 339/17 |
| 4,678,252 | 7/1987 | Moore | 439/62 |
| 4,699,593 | 10/1987 | Grabbe et al. | 439/71 |
| 4,806,104 | 2/1989 | Cabourne | 439/66 |
| 4,891,023 | 1/1990 | Lopata | 439/637 |
| 4,906,194 | 3/1990 | Grabbe | 439/71 |
| 4,921,430 | 5/1990 | Matsuoka | 439/72 |
| 4,927,369 | 5/1990 | Grabbe et al. | 439/66 |
| 4,961,709 | 10/1990 | Noschese | 439/66 |
| 4,969,826 | 11/1990 | Grabbe | 439/66 |
| 4,998,886 | 3/1991 | Werner | 439/66 |
| 5,007,845 | 4/1991 | Grabbe | 439/73 |
| 5,015,191 | 5/1991 | Grabbe et al. | 439/71 |
| 5,017,158 | 5/1991 | Liu et al. | 439/609 |
| 5,030,144 | 7/1991 | Seidler | 439/876 |
| 5,092,783 | 3/1992 | Suarez et al. | 439/71 |
| 5,137,456 | 8/1992 | Desai et al. | 439/66 |
| 5,139,427 | 8/1992 | Boyd et al. | 439/66 |
| 5,152,694 | 10/1992 | Bargain | 439/66 |
| 5,152,695 | 10/1992 | Grabbe et al. | 439/71 |
| 5,167,512 | 12/1992 | Walkup | 439/66 |
| 5,184,962 | 2/1993 | Noschese | 439/66 |
| 5,199,889 | 4/1993 | McDevitt, Jr. | 439/66 |
| 5,230,632 | 7/1993 | Baumberger et al. | 439/66 |
| 5,259,769 | 11/1993 | Curise et al. | 439/65 |
| 5,308,252 | 5/1994 | Mroczkowski et al. | 439/66 |
| 5,324,205 | 6/1994 | Ahmad et al. | 439/66 |
| 5,338,232 | 8/1994 | Bernier | 439/733 |
| 5,342,205 | 8/1994 | Hashiguchi | 439/66 |
| 5,380,210 | 1/1995 | Grabbe et al. | 439/66 |
| 5,395,252 | 3/1995 | White | 439/66 |
| 5,403,194 | 4/1995 | Yamazaki | 439/66 |
| 5,427,535 | 6/1995 | Sinclair | 439/66 |
| 5,437,556 | 8/1995 | Bargain et al. | 439/66 |
| 5,484,295 | 1/1996 | Mowry et al. | 439/66 |
| 5,556,308 | 9/1996 | Brown et al. | 439/746 |
| 5,573,435 | 11/1996 | Grabbe et al. | 439/862 |
| 5,588,845 | 12/1996 | Naitoh et al. | 439/66 |
| 5,588,846 | 12/1996 | Irlbeck et al. | 439/66 |
| 5,628,639 | 5/1997 | Eichholz, Jr. et al. | 439/79 |
| 5,653,598 | 8/1997 | Grabbe | 439/66 |
| 5,805,419 | 9/1998 | Hundt et al. | 361/719 |
| 5,893,761 | 4/1999 | Longueville | 439/66 |
| 5,913,687 | 6/1999 | Rathburn | 439/66 |
| 5,938,451 | 8/1999 | Rathburn | 439/66 |

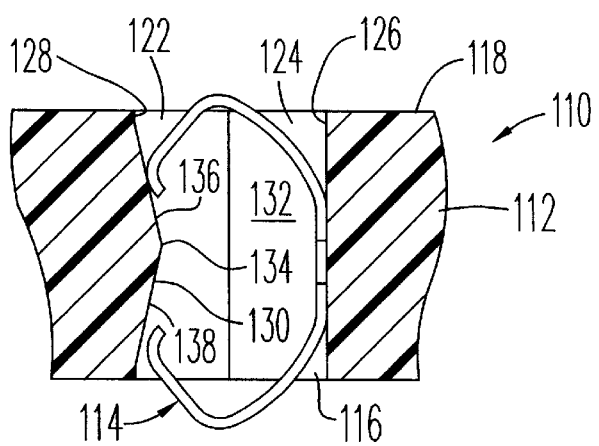
FIG. 8
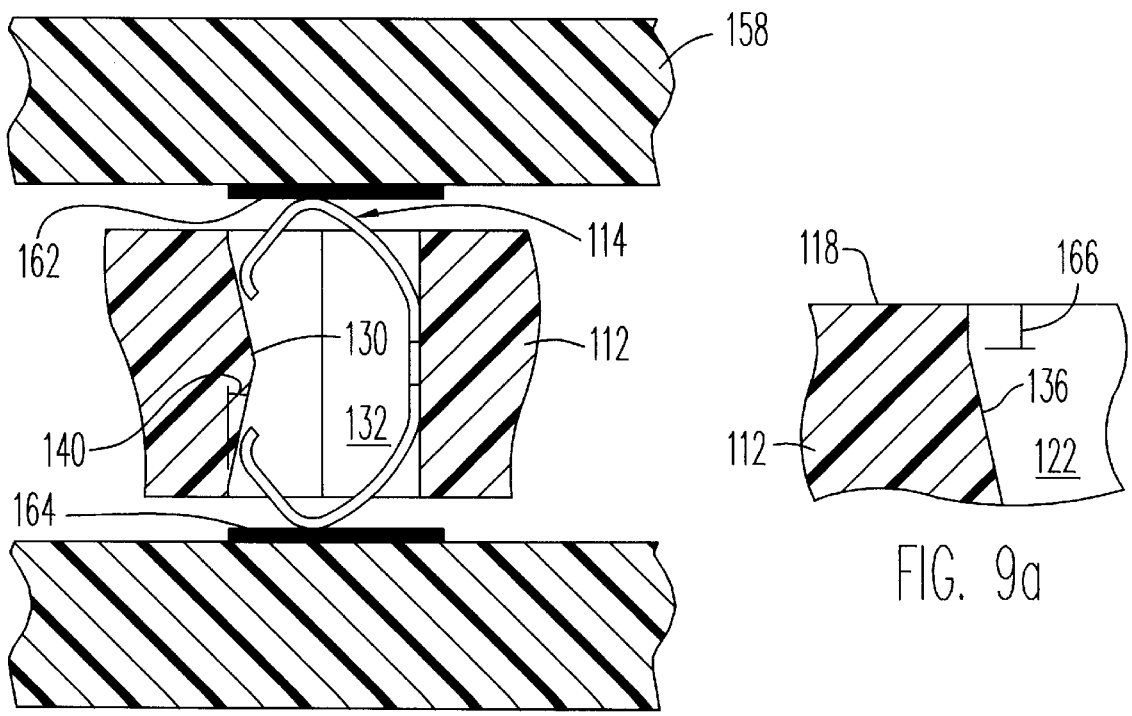
FIG. 9
FIG. 9a

INTERPOSER ASSEMBLY

This application is a continuation-in-part of our application Ser. No. 09/455,989 filed Dec. 7, 1999, now U.S. Pat. No. 6,176,707, which is a continuation of our now-abandoned application Ser. No. 09/287,896 filed Apr. 7, 1999 which is a continuation-in-part of our now-abandoned application Ser. No. 08/960,953 filed Oct. 30, 1997.

FIELD OF THE INVENTION

The invention relates to interposer assemblies used for forming electrical connections between spaced contact pads on circuit members.

BACKGROUND OF THE INVENTION

Interposer assemblies electrically connect between densely spaced contact pads on adjacent parallel circuit members. Interposer assemblies are used wherever dense connections are required. The assemblies are particularly well suited for use in portable electronic devices such as cell phones, digital assistants, notebook computers and the like. The assemblies enable a reduction in the size and weight of the electronic devices.

The pads on the circuit members are arranged in identical patterns. Commonly, the circuit members are a circuit board and a ceramic plate carrying integrated circuits. The interposer assembly includes an insulating plate and a plurality of through-contacts carried in the plate and arranged in the same pattern as the pads on the circuit members. The contacts project above the top and bottom sides of the plate. The interposer assembly is sandwiched between the two members which are held together with the contacts forming electric connections between aligned pairs of pads.

Interposer assemblies form electrical connections between contact pads arranged in a very close proximity to each other. The pads may be arranged on a one millimeter center-to-center grid. Each assembly may have as many as 961 contacts. Four assemblies are conventionally mounted on a single frame with a total of 3,844 contacts in the frame.

In addition to requiring contacts which can be spaced very close to each other, the contacts must make reliable electrical connections with the pads during the lifetime of the electronic device. The circuit members may move towards and away from each other due to changes in operating temperature, handling of the device, or the like. The contacts must make reliable electrical connection with the pads despite the relative movement of the circuit members. Failure of a single contact to make a reliable connection may render the entire electronic device useless.

The individual electrical contact in the assembly acts as a spring that extends or compresses in response to the circuit members moving away or towards one another. The contact is compressed and deforms elastically when sandwiched between the contact pads. The contact must be able to extend outwardly when the circuit members move apart and compress when the circuit members move back together.

Interposer assemblies must occupy a minimum width between the circuit members. This requires that the individual electrical contacts in the assembly have a limited height. Yet the contacts must possess the required resiliency for maintaining reliable electrical contact with the pads throughout repeated cycles of extension and compression.

Further, the contacts must be compressed with a low mechanical closure force when the interposer assembly is sandwiched between the circuit members. Low closure force is required in order to prevent undue stress on the contact or a ceramic circuit member. A high closure force could distort or possibly break the contact or the ceramic member. Permanent distortion or deformation of the contact member may reduce or destroy the resiliency of the contact. The contact cannot lose resiliency to the extent that the contact is unable to maintain reliable electrical connections between the pads.

Conventional interposer assemblies use contacts which occupy a relatively large amount of space in the supporting plate making it difficult to meet closely spaced grid requirements. These assemblies are relatively expensive to manufacture and assemble.

Applicants' U.S. patent application Ser. No. 09/455,989, assigned to the assignee of the present invention, discloses an interposer assembly including metal through contacts loosely confined in closely spaced passages extending through an insulating plate. On rare occasions, contacts inserted into the passages in the above interposer assembly do not work properly.

SUMMARY OF THE INVENTION

The invention is improved interposer assemblies of the type having metal through contacts loosely confined in closely spaced passages extending through an insulating plate. The plate is a one-piece design and includes contact retention projections extending into the passages and sloped cam surfaces provided on both sides of the individual projections. The cam surfaces are preferably symmetrical about a central plane of the plate. Cam followers on the free ends of the contacts engage the cam surfaces and are guided past the projections which then hold the contacts in place. The contacts may be inserted from either side of the plate.

The sloped cam surfaces extend to the adjacent walls of the his contact passages and do not form sharp corners with the passage walls. The sloped cam surfaces assure that during insertion of the contacts into the passages the lead ends of the contacts are guided smoothly over the projections and do not hang up in the corners or junctions between the projections and the adjacent walls.

When sandwiching the interposer assembly between the circuit members, the cam followers engage the cam surfaces and slide on the cam surfaces towards the end of the projection. The cam followers remain in contact with the cam surfaces while sandwiched between the circuit members. Because the cam followers engage the projections, the free ends of the uncompressed contacts can be spaced sufficiently close together that the arms of the contact always remain within the passage. The contacts cannot fall out of the passage nor can the arms become sandwiched between the plate and a circuit member.

In a first embodiment interposer assembly sloped cam surfaces on each projection are planar and extend inwardly from one side of a passage into the passage to the inner end of the projection. The cam surfaces slope at a shallow angle with respect to the axis of the contact passage. In the first embodiment the cam surfaces preferably slope at an angle of about 25 degrees with respect to the axis of the contact passage and do not intersect at the end of the retention projection.

On occasion, it has been found that a large closure force is necessary to sandwich the first embodiment interposer assembly between the circuit members. Sliding of the cam followers on the cam surfaces generates frictional forces that resist the motion of the cam followers. The closure force must overcome the frictional forces to slide the cam followers on the cam surfaces. It is believed that the frictional forces may increase the closure force. The large closure force may permanently deform the contacts and cause the contacts to lose the resiliency needed for reliable electrical connections between the pads.

In other embodiments, the cam surfaces are configured to reduce the frictional forces generated by the cam followers sliding on the cam surfaces. The cam surfaces include portions that extend inwardly into the passage at an angle less than 25 degrees. When sandwiching the second embodiment interposer assembly between the circuit members, the cam followers slide more readily along these cam surfaces. The shallow angle of these cam surfaces reduce the frictional forces and reduces the closure force.

In second and third embodiment interposer assemblies the shallow cam surfaces are planar and extend inwardly from the plate and into the passages to free ends at the ends of the projection. The cam surfaces slope at angles of about 12 degrees. The free ends of the cam surfaces on each projection intersect at the free end of the projection.

In a fourth embodiment interposer assembly, the cam surfaces have variable slopes. The individual cam surfaces have a first slope near the plate and a second, preferably shallower, slope away from the plate near the free end of the projection. The cam surfaces may be curved to continually change the camming slope from the first slope to the second slope, or the individual cam surfaces may include two or more portions having different slopes. The cam surface portions may include both curved and planar portions.

When sandwiching the fourth embodiment interposer assembly between the circuit members, the cam followers initially engage and begin sliding on the first slope of the cam surfaces. As the contacts are fully compressed, the cam followers slide along the cam surfaces and travel to a closed position on the second slope of the cam surface portions. By varying the camming slope along the path of the cam followers, a steeper slope can be provided at the beginning of travel and a shallower slope at the end. The steeper initial slope enables the cam followers to firmly engage the projections when the closing force is low. The shallower final slope prevents excessive frictional forces from being generated and assures a low closing force.

Other objects and features of the invention will become apparent as the description proceeds, especially when taken in conjunction with the accompanying drawings illustrating the invention, of which there are eight sheets of drawings and four embodiments are disclosed.

DESCRIPTION OF THE DRAWINGS

FIG. 8 is a sectional view of a second embodiment interposer assembly per the invention like FIG. 2;

FIG. 9 is a sectional view illustrating the position of the assembly of FIG. 8 between two circuit members;

FIG. 9a is a closer view of the interposer plate shown in FIG. 9;

DESCRIPTION OF THE PREFERRED EMBODIMENTS

Figure 1:
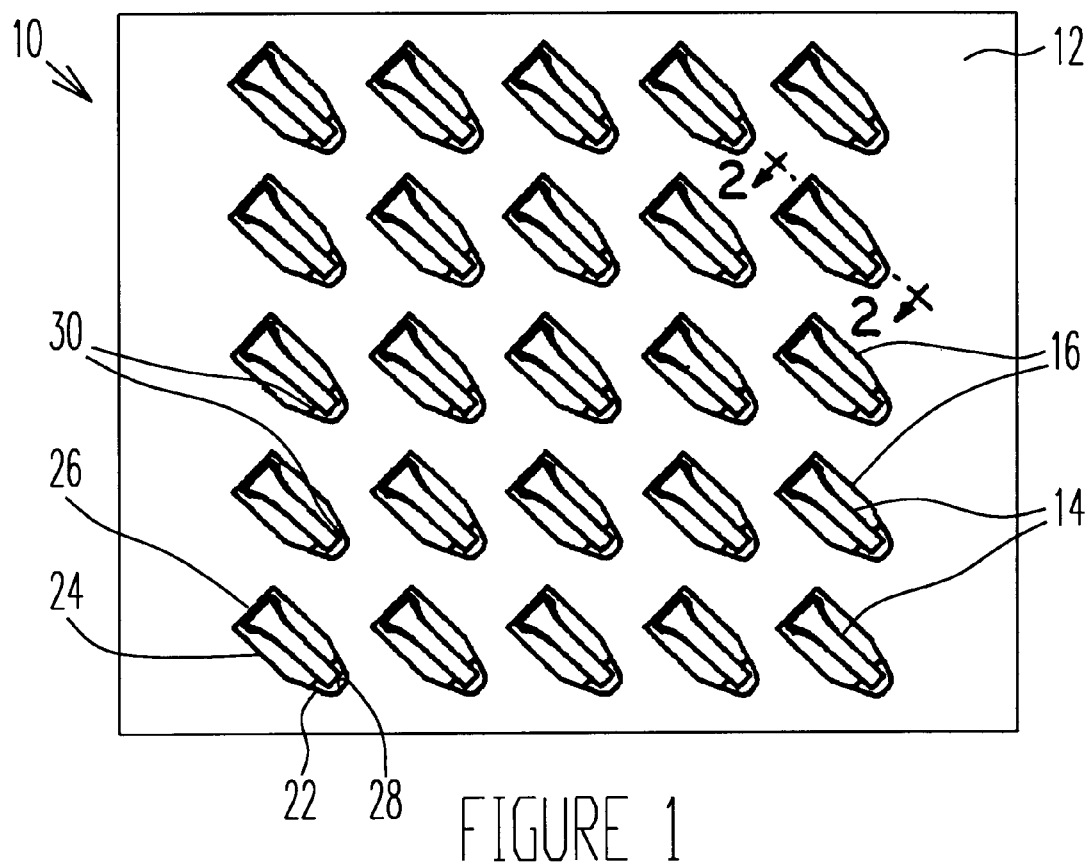
FIG. 1 is a top view of a first embodiment interposer assembly per the invention.
Figure 2:
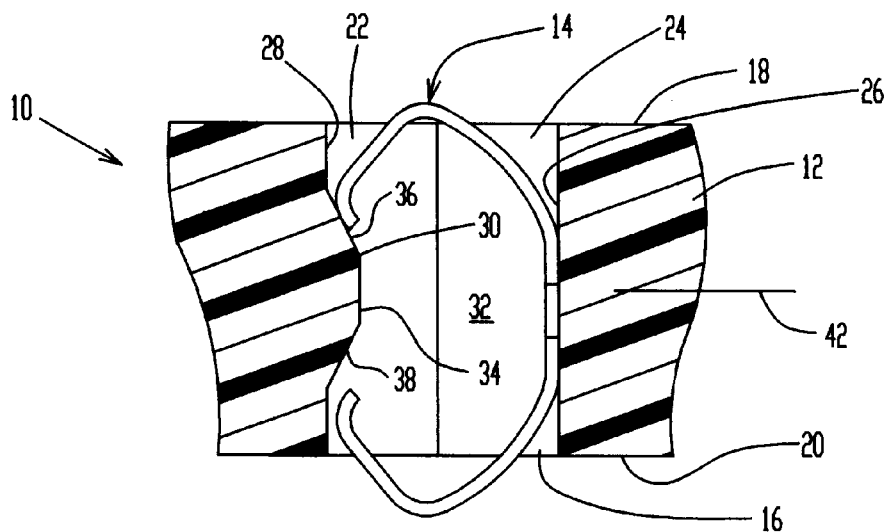
FIG. 2 is a sectional view taken along line 2—2 of FIG. 1.

FIGS. 1–7 illustrate a first embodiment interposer assembly 10. Interposer assembly 10 includes a flat plate 12 formed from an integral body of insulating material with a plurality of metal through contacts 14 positioned in contact passages 16 extending through the thickness of the plate between opposed plate top and bottom sides 18 and 20. One contact 14 is positioned in each passage 16. As shown in FIGS. 1 and 2, passages 16 are each provided with a reduced width portion 22 and a uniform width portion 24 away from portion 22. Flat end wall 26 extends across the uniform width portion 24 and is located opposite reduced width end wall 28. Wall 28 extends across the reduced width portion.

Contact retention projections 30 are provided in the reduced width portions 22 of passages 16. Projections 30 extend a distance into the passages and narrow the passages at portions 32 between the projections and walls 26. Each projection 30 extends into portion 22 to an inner free end 34 spaced from wall 26 and facing the narrowed passage portion 32. The projections 30 are centered in the passages 16 between the top and bottom sides of the plate.

Figure 3:
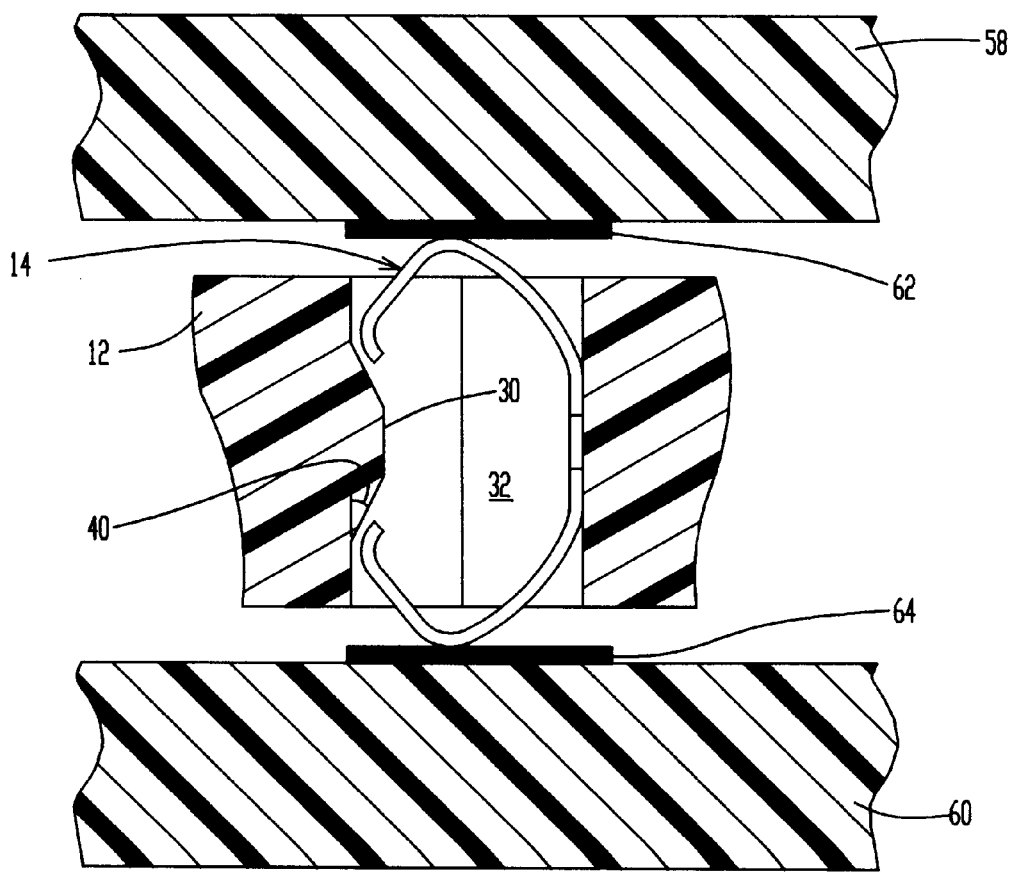
FIG. 3 is a sectional view illustrating the position of the assembly of FIG. 1 between two circuit members.

The projections 30 include sloped upper and lower cam surfaces 36 and 38 facing plate top and bottom 18 and 20, respectively. The cam surfaces 36 and 38 are spaced in from the top and bottom sides of the plate. Each upper cam surface 36 faces top side 18 and extends from wall 28 towards bottom side 20 to the inner end 34. Each lower cam surface 38 faces bottom side 20 and extends from wall 28 towards top side 18 to the inner end 34. As shown in FIG. 3, the upper and lower cam surfaces 36 and 38 are smooth, generally planar and slope at an angle 40 with respect to the axis of passage 16. Angle 40 is preferably about 25 degrees. Each projection 30 and its associated cam surfaces 36 and 38 are symmetrical about a center plane 42 located in the center of the plate 12 midway between the top and bottom sides of the plate 12. Cam surfaces 36 and 38 facilitate insertion of contacts 14 into passages 16 from either the top or bottom side of plate 12.

Figure 7:
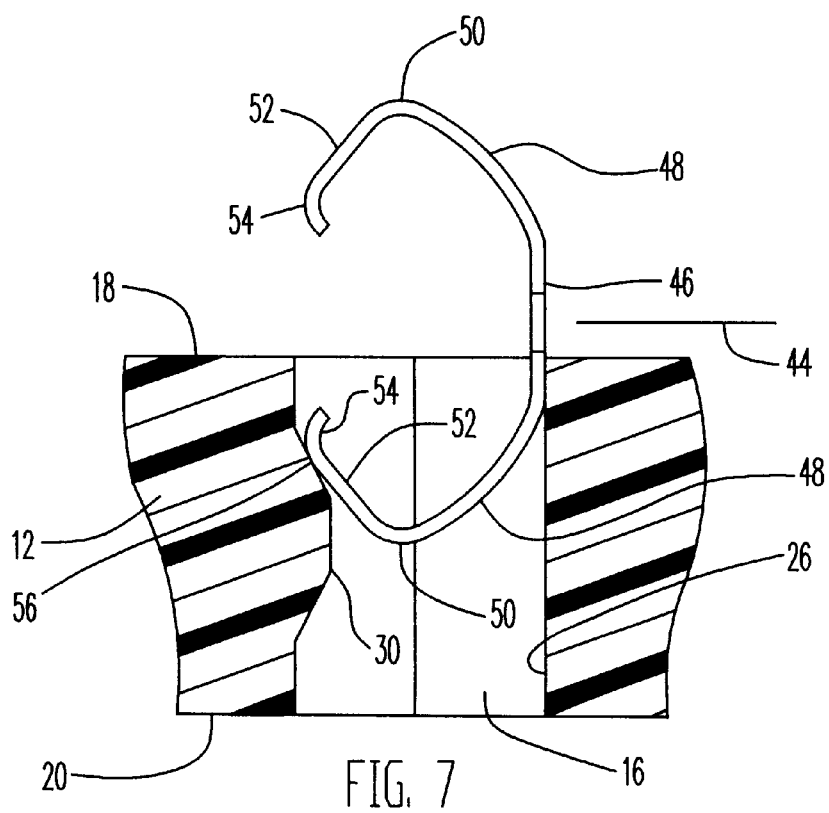
FIG. 7 is a sectional view illustrating insertion of the contact member of FIG. 6 into a passage extending through the plate.

The contact 14 is arcuate and symmetrical to either side of a center plane 44, as shown in FIG. 7. Each contact includes a flat central spine 46 centered on plane 44 and upper and lower tapered spring arms 48 extending from the ends of spine 46. Curved contact noses or pad contacts 50 are provided on the outer ends of arms 48. Retention legs 52 extend inwardly from the noses to rounded free ends 54. When the contact 14 is unstressed, contact noses 50 are spaced apart a distance greater than the thickness of the plate 12. The legs 52 angle away from spine 46 so that the noses 50 are located between the ends 54 and the spine.

Each metal contact 14 is preferably formed from uniform thickness strip stock, which may be suitably plated beryllium copper. The contacts 14 are each bent from identical flat preforms punched from thin strip metal stock.

Contacts 14 are inserted into passages 16 as shown in FIG. 7. One nose 50 of the contact is extended into the end of the passage opening at plate top side 18 and is positioned between the projection 30 and wall 26. As the contact is inserted into the passage, surface 56 on the lower leg 52 serves as a cam follower and is guided by upper cam surface 36 to the end of the projection. Spine 46 slides along wall 26. The upper cam surface 36 extends smoothly from wall 28 so that contact 14 does not bind or catch between projection 30 and wall 28 when leg 52 engages the projection 30.

As the contact is moved further into the passage the lower spring arm is elastically stressed as lower leg 52 moves past projection 30 and then snaps back under lower cam surface 38. With the contact inserted in passage 16, the spring arms 48 are bowed away from wall 26 with the upper end 54 located above upper cam surface 36 and the lower end 54 located below the lower cam surface 38. The spine 46 of the contact center portion is adjacent the flat wall 26. In this position, the contact 14 is loosely confined within passage 16 with both free ends 54 located within the thickness of the plate 12. The convex side of each free end 54 faces the adjacent cam surface 36 or 38. Confinement of the free ends 54 within the thickness of the plate 12 assures that the contacts 14 cannot slip past the retention projections 30 and out of the passages 16.

If desired, contacts 14 can be inserted into the plate from the bottom side 20 in the same manner as previously described.

Contacts 14 are loosely held in passages 16. Projections 30 extend between contact ends 54. The distance between ends 54 is greater than the height of projections 30 between the ends 54, permitting limited free movement or float of the contacts in passages 16. FIG. 2 illustrates the position of the contact in the passage when plate 12 is horizontal and loose contact 14 is supported in passage 16 against gravity by projection 30. The upper curved end 54 of the upper leg 52 rests on the upper cam surface 36 of projection 30 and the lower curved end 54 of the lower leg 52 remains in the passage. Spine 46 engages wall side 26 and maintains the contact in substantially vertical alignment in the passage.

Spine 46 also resists rocking or rotation of the contact in a clockwise or counterclockwise direction as viewed in FIG. 2. Rocking of the contact is also limited by the proximity of the contact ends 54 to sides 22 and cam surfaces 36 and 38. Loose confinement of the contact in the passage assures that the contact is in proper position to be collapsed to form a reliable connection between opposed pads.

As illustrated in FIG. 1, the passages 16 are arranged close to each other in a dense array on plate 12 in order to permit forming electrical connections between similar arrays of contact pads on circuit elements located above and below the assembly. Conventionally, assembly 10 is used for forming electrical connections between contact pads on a ceramic integrated circuit and contact pads of a circuit board. The assembly may be used for forming electrical connections between contact pads on two circuit boards or between contact pads on other types of circuit members.

FIG. 3 illustrates the interposer assembly 10 positioned between upper and lower circuit members 58 and 60 with contact pads 62 and 64 on the members located above and below contacts in the assembly. The contacts lightly engage the pads and are not stressed.

Figure 4:
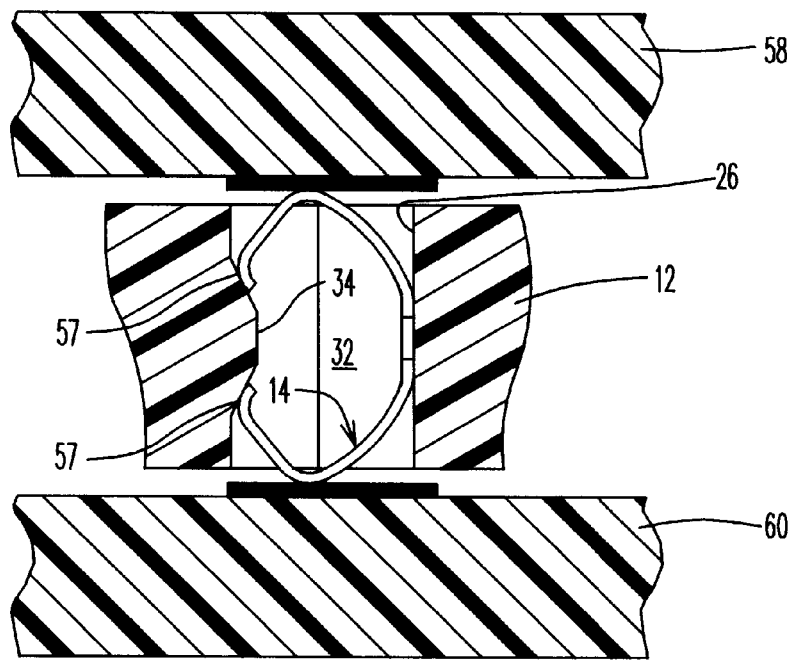
FIG. 4 is a view like FIG. 3 showing the assembly partially sandwiched between the circuit members.
Figure 5:
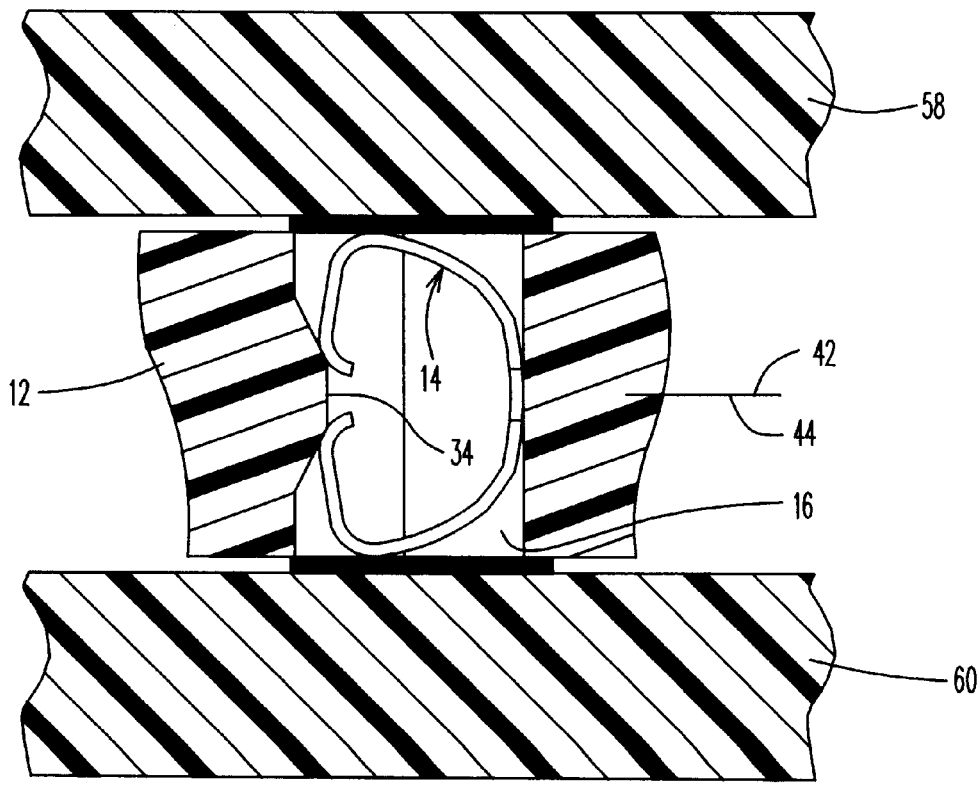
FIG. 5 is a view like FIG. 4 showing the assembly sandwiched between the circuit members.
Figure 6:
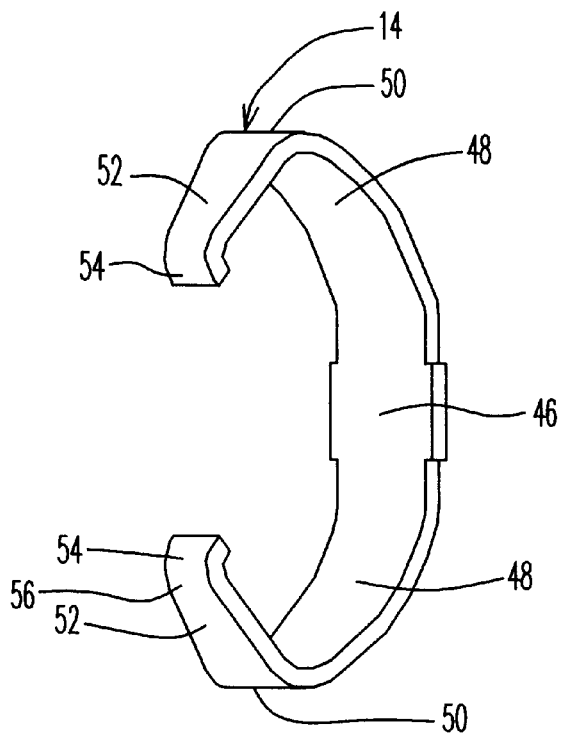
FIG. 6 is a perspective view of the contact shown in the assembly of FIG. 1.

FIG. 4 illustrates the assembly 10 when partially sandwiched between members 58 and 60. When the members are brought toward assembly 10 the two contact pads 62 and 64 are moved together to reduce the height of contacts 14 and elastically bend the two tapered spring arms 48. The curved ends 54 of retention legs 52 move towards each other and towards wall 26. The upper and lower curved ends. 54 contact upper and lower cam surfaces 36 and 38 respectively as shown in FIG. 5. Convex surfaces 57 on the curved ends 54 serve as cam followers and are guided by the cam surfaces. After contact, each cam follower surface 57 slides along the cam surface towards projection free end 134. The curved ends 54 roll slightly on the cam surfaces and maintain tangential engagement with the cam surfaces as the legs slide inwardly toward the free end of the projection. Spine 46 remains flush on wall 26 and holds the contact in proper orientation. Contact noses 50 are wiped along the contact pads toward wall 28.

FIG. 5 illustrates the assembly 10 when fully sandwiched between members 58 and 60 with the members held tightly against the assembly plate 12. When the members are brought into contact with the assembly 10 the plane of symmetry 44 of each contact 14 coincides with the plane of symmetry 42 of the plate and projections 30. Contact pads 62 and 64 reduce the height of contacts 14 to a minimum and further elastically bend spring arms 48. The upper and lower curved ends 54 remain engaged with the cam surfaces near projection inner or free end 34. The contact spine 46 remains on wall 26. Contact noses 50 have moved further along the contact pads to their position nearest wall 26. The movement or wiping of contact noses 50 along the contact pads make clean, low resistance pressure electrical connections between the contact noses 50 and the pads 62 and 64.

As illustrated in FIG. 5, foreshortening of contact 16 moves the curved end portions 54 of retention legs 52 together and holds the end portion cam follower surfaces 57 against cam surfaces 36 and 38 of projection 30. Contact pressure is maintained by elastic bending of contact 14 despite engagement of the end portions of the contact with the projection. The contacts 14 are compressed or extended elastically in response to the circuit members moving toward or away from one another in use and maintain reliable electrical connections between pairs of contact pads. The shallow slope of the cam surfaces and the curved contact end portions allow the contacts to deform without binding on the projections. Binding undesirably increases the closing force and can permanently deform contacts. On collapse, the height of the contact 14 is reduced as described without capture of a free end 54 on one side of the plate. Such capture would prevent the contact from forming a reliable electrical connection between opposed pads.

FIGS. 8–12 illustrate a second embodiment interposer assembly 110. Interposer assembly 110 includes a contact housing or flat plate 112 formed from an integral body of insulating material with a plurality of metal through contacts 114, like metal contacts 14, positioned in contact passages 116 extending through the thickness of the plate between opposed plate top and bottom sides 118 and 120. As shown in FIG. 8, passages 116 are like passages 16 of plate 12. Each passage 116 has a reduced width portion 122 and a uniform width portion 124 away from portion 122. Flat end wall 126 extends across the uniform width portion 124 and is located opposite reduced width end wall 128. Wall 128' extends across the reduced width portion.

Contact retention projections 130 are provided in the reduced width portions 122 of passages 116. Projections 130 extend a distance into the passages and narrow the passages at portions 132 between the projections and walls 126. Each projection 130 extends into portion 122 to an inner free end 134 spaced from wall 126 and facing the narrowed passage portion 132. The projections 130 are centered in the passages 116 between the top and bottom sides of the plate.

The projections 130 include sloped upper and lower cam surfaces 136 and 138 facing plate top and bottom 118 and 120, respectively. Each upper cam surface 136 faces top side 118 and extends from wall 122 towards bottom side 120 to the inner end 134. Each lower cam surface 138 faces bottom side 120 and extends from wall 128 towards top side 128 to the inner end 134. As shown in FIG. 9, the upper and lower cam surfaces 136 and 138 are smooth, generally planar and slopes at an angle 140 of about 12 degrees with respect to the axis of passage 116 and intersect each other at the free end 134 of the projections 130.

Each projection 130 and its associated cam surfaces 136 and 138 are symmetrical about a center plane 142 located in the center of the plate 112. Cam surfaces 136 and 138 facilitate insertion of contact 114 into passage 116 from either the top or bottom side of plate 112.

Each metal contact 114 may be identical to contact 14. The contact 114 is arcuate and symmetrical about a center plane 144. Each contact includes a flat central spine 146 centered on plane 144 and upper and lower tapered spring arms 148 extending from the ends of spine 146. Curved contact noses or pad contacts 150 are provided on the outer ends of arms 148. Retention legs 152 extend inwardly from the noses to rounded free ends 154. The contact noses 150 are spaced apart a distance greater than the thickness of the plate 112. The legs 152 extend away from spine 146 so that the noses 150 are located between the ends 154 and the spine.

Figure 12:
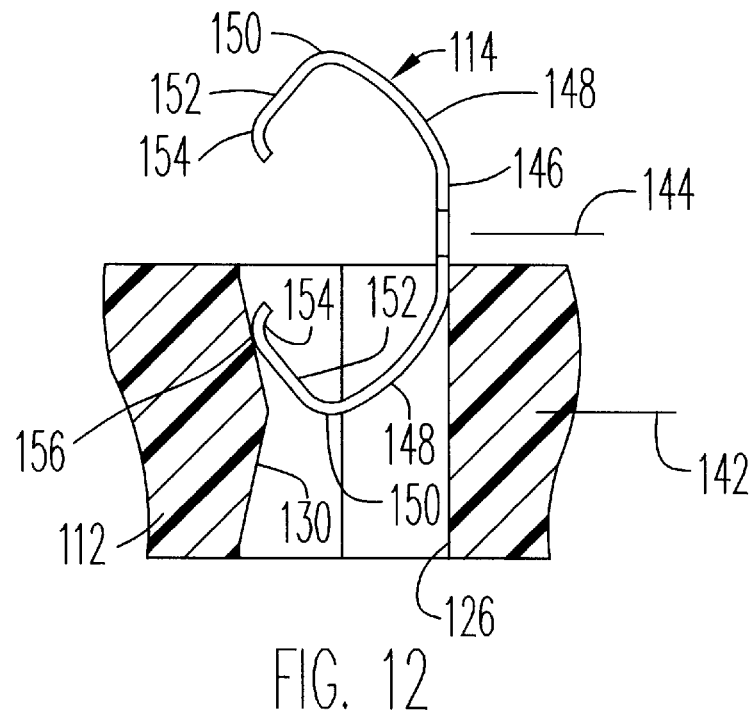
FIG. 12 is a sectional view illustrating insertion of the contact member of FIG. 11 into a passage extending through the plate.

Contacts 114 are inserted into passages 116 as shown in FIG. 12. One nose 150 of the contact is extended into the end of the passage opening at plate top side 118 and is positioned between the projection 130 and wall 126. As the contact is inserted into the passage, a surface 156 on the lower leg 152 serves as a cam follower and is guided by upper cam surface 136 to the end of the projection. Spine 146 slides along wall 126. The upper cam surface 136 extends smoothly from wall 128 so that contact 114 does not bind or catch between projection 130 and wall 128 when leg 152 engages the projection 130.

The contact is then moved further into the passage and the lower spring arm is elastically stressed until lower leg 152 moves past projection 130 and then snaps back under lower cam surface 138. With the contact inserted in passage 116 the spring arms 148 are bowed out from wall 126 with the upper end 154 located above upper cam surface 136 and the lower end 154 located below the lower cam surface 138. The spine 146 of the contact center portion is adjacent the flat wall 126. In this position, the contact 114 is loosely confined within passage 116 with both free ends 154 located within the thickness of the plate 112. Confinement of the free ends within the thickness of the plate assures that, on collapse, the height of the contact is reduced as described without capture of a free end on one side of the plate. The convex side of each free end 154 faces the adjacent cam surface 136 or 138.

If desired, contacts 114 can be inserted into the plate from the bottom side 120 in the same manner as previously described.

Contacts 114 are loosely held in passage 116. Projections 130 extend between contact ends 154. The distance between ends 154 is greater than the height of projections 130 between the ends 154, permitting limited free movement or float of the contacts in passages 116. FIG. 8 illustrates the position of the contact in the passage when plate 112 is horizontal and the loose contact 114 is supported by the projections 130 in passage 116 against gravity. The upper curved end 154 of the upper leg 152 rests on the upper cam surface 136 of projection 130 and the lower curved end 154 of the lower leg 152 remains in the passage. Spine 146 engages wall side 126 and maintains the contact in substantially vertical alignment in the passage.

Spine 146 also resists rocking or rotation of the contact in a clockwise or counterclockwise direction as viewed in FIG. 8. Rocking of the contact is also limited by the proximity of the contact ends 154 to side 122 and cam surfaces 136 and 138. The loose confinement of the contact in the passage assures that the contact is in position to be collapsed to form a reliable connection between opposed pads.

Passages 116 are arranged close to each other in a dense array in plate 112 in the same manner as passages 16 are arranged in plate 12.

FIG. 9 illustrates the interposer assembly 110 positioned between upper and lower circuit members 158 and 160 with contact pads 162 and 164 on the members located above and below contacts in the assembly. The contacts lightly engage the pads and are not stressed.

Figure 10:
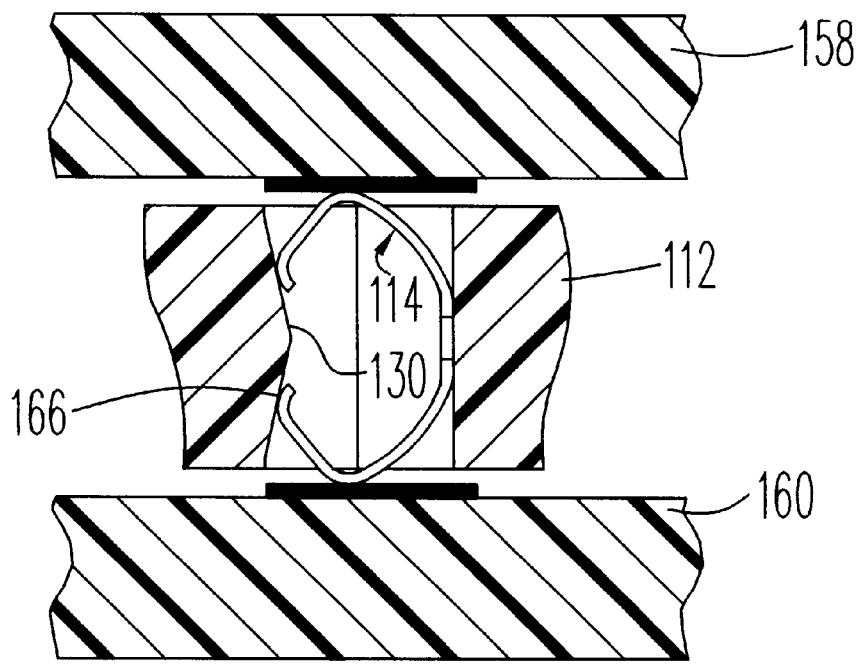
FIG. 10 is a view like FIG. 9 showing the assembly partially sandwiched between the circuit members.

FIG. 10 illustrates the assembly 110 when partially sandwiched between members 158 and 160. When the members are brought toward assembly 110 the two contact pads 162 and 164 are moved together to reduce the height of contacts 114 and elastically bend the two tapered spring arms 148. The curved ends 154 of retention legs 152 move towards each other and towards wall 126. The upper and lower curved ends 154 contact upper and lower cam surfaces 136 and 138 respectively as shown in FIG. 10. Convex surfaces 166 on the curved ends 154 serve as cam followers and are guided by the cam surfaces. After contact, the cam follower surfaces 166 slides along the cam surfaces towards projection inner end 134. The curved ends 154 roll slightly on the cam surfaces and maintain tangential engagement with the cam surfaces as the legs slide inwardly toward the free end of the projection. Spine 146 remains flush on wall 126. Contact noses 150 are wiped along the contact pads toward wall 128.

Figure 11:
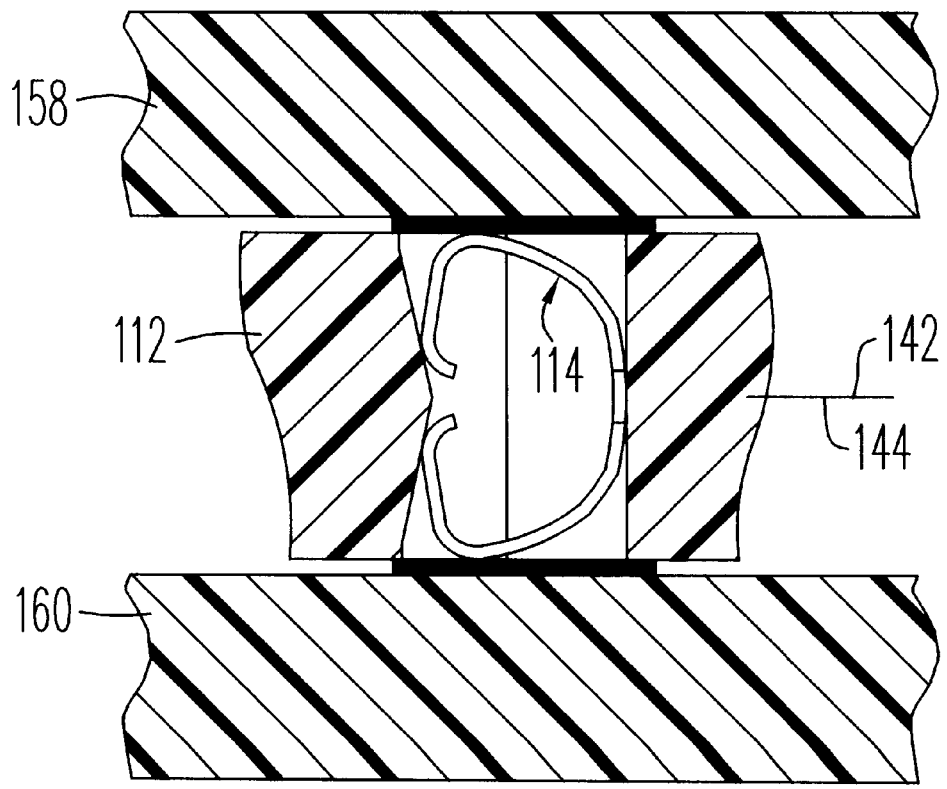
FIG. 11 is a view like FIG. 10 showing the assembly sandwiched between the circuit members.

FIG. 11 illustrates the assembly 110 when fully sandwiched between members 158 and 160 with the members held tightly against the assembly plate 112. When the members are brought into contact with the assembly 110 the plane of symmetry 144 of the contacts 64 coincides with the plane of symmetry 142 of the projections 130. Contact pads 162 and 164 reduce the height of contacts 114 to a minimum and further elastically bend spring arms 148. The upper and lower curved ends 154 remain engaged with the cam surfaces with the cam follower surfaces 166 near projection inner end 134. The contact spine 149 remains on wall 126. Contact noses 150 have moved further along the contact pads to their position nearest wall 128. The movement or wiping of contact noses 150 along the contact pads make clean, low resistance pressure electrical connections between the contact noses 150 and the pads 162 and 164.

Contact pressure is maintained by elastic bending of contact 114 despite engagement of the end portions of the contact with the projection. The resilient contacts 114 can each extend or compress in response to the circuit members moving away or towards one another in use and maintain reliable electrical connections between pairs of contact pads.

The slope of the cam surfaces and the curved contact end portions allow the contact to deform without binding on the projection, which could undesirably increase the closing force and may permanently deform contacts.

While sandwiching the interposer assembly between the circuit members as shown in FIGS. 9–12, the contact pads exert a vertical closing force on the contacts. The closing force compresses the contacts and urges the curved ends of the individual contacts towards each other. As the contacts compress, the closing force increases due to the resiliency of the contacts.

The ends of the contacts engage and slide along the cam surfaces. The cam follower surfaces 166 slide along the upper and lower cam surfaces 136 and 138 and rub against them. Friction between the cam follower surfaces 166 and the cam surfaces 136, 138 generates frictional forces that act on the cam follower surfaces 166. The frictional forces oppose the movement of the cam follower surfaces 166 and resist the compressing of the contacts. The closing force must overcome the frictional forces to compress the contacts and sandwich the interposer assembly between the circuit members.

It is desirable that the frictional forces be minimized to assure a low closing force. A portion of the closing force presses the cam follower surfaces 166 against the cam surfaces. The greater the force pressing the cam followers against the cam surfaces, the greater the frictional forces generated by the cam followers 166 sliding on the cam surfaces. The remainder of the closing force acts parallel to the cam surfaces and urges the cam follower surfaces 166 along the cam surfaces towards the ends of the projections.

Reducing the amount of the closing force that presses the can follower surfaces 166 against the cam surfaces reduces undesirable frictional forces. The shallower or more vertical the slope of the cam surfaces as shown in FIGS. 9–12, the less the closing force presses the cam follower surfaces 166 against the cam surfaces.

The cam surfaces 136 and 138 extend at a constant slope from the wall to the free end of the projection. The cam surfaces preferably extend from the top and bottom sides of the plate to the free end of the projection. The projection extends a distance into the passage to reliably retain the contacts in the passages. This allows the slope of the planar cam surfaces 136, 138 to be as shallow as possible for the thickness of the plate 112.

As best seen in FIG. 9a, the cam surfaces 136 and 138 are recessed a distance 166 of about 0.005 inches from the top and bottom sides of the plate. Plate 112 is conventionally molded with core pins that create the passages 116. The cam surfaces as shown are recessed the minimum amount necessary to accommodate tooling that holds the pins. The retention projection 130 extends across nearly the entire thickness of the plate along the passage 116 and in effect extends the maximum distance possible between the top and bottom sides of the plate 112.

Figure 13:
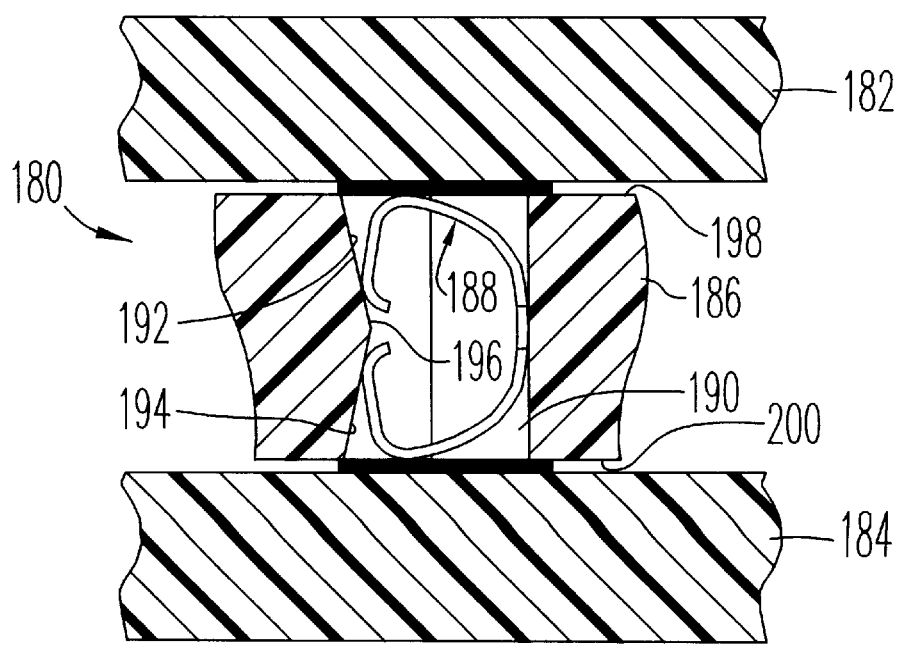
FIG. 13 is a sectional view of a third embodiment interposer assembly per the invention like FIG. 11.

FIG. 13 illustrates a third embodiment interposer assembly 180 like interposer assembly 110 sandwiched between two circuit members. 182, 184. Insulating plate 186 is formed from an integral body of insulating material and holds contacts 188, like contacts 114, in contact passages 190. Cam followers on the ends of the individual contacts 188 engage upper and lower cam surfaces 192, 194 on retention projections 196. The cam surfaces extend to the top side 198 and bottom side 200 of the plate 186 to further minimize the slope of the cam surfaces with respect to the axis of the passage 190 as compared to second embodiment cam surfaces 136 and 138. The retention projections 196 extend the full thickness of the plate 186 between the top and bottom sides of the plate 186.

Figure 14:
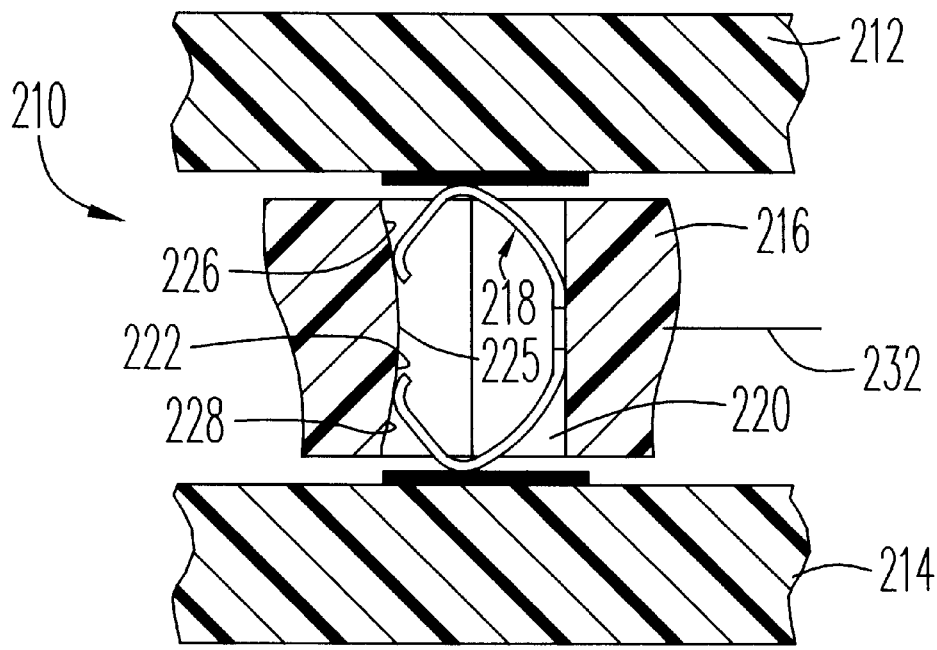
FIG. 14 is a sectional view of a fourth embodiment interposer assembly per the invention like FIG. 9.
Figure 15:
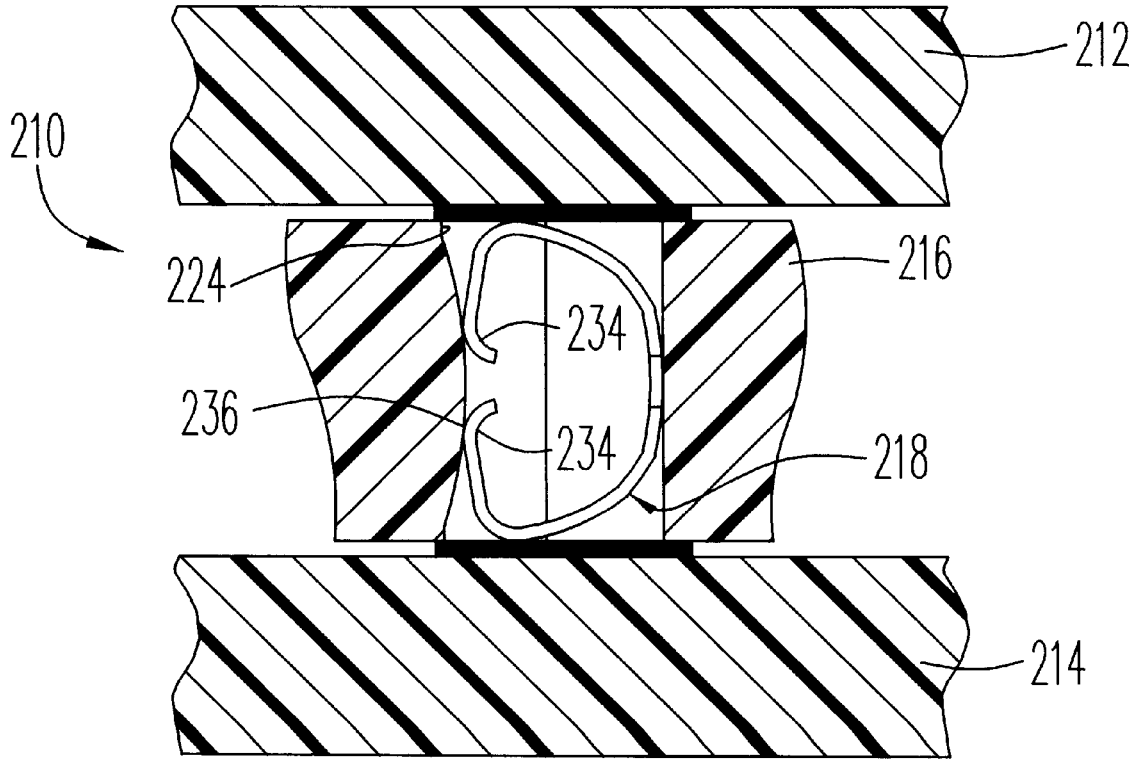
FIG. 15 is a view like FIG. 14 showing the assembly sandwiched between the circuit members.

FIGS. 14 and 15 illustrate a fourth embodiment interposer assembly 210 between two circuit members 212 and 214. Interposer assembly 210 includes a flat plate 216 formed of an integral body of insulating material with a plurality of metal through contacts 218, like metal contacts 114, positioned in contact passages 220, like contact passages 116, extending through the thickness of the plate 216. Contact retention projections 222 extend into the passages from passage walls 224 to free ends 225. The projections 222 are centered in the passages 220 between the top and bottom sides of the plate.

The projections 222 include like curved upper and lower cam surfaces 226 and 228 facing the plate top and bottom respectively. The slope of the individual cam surfaces 226 and 228 varies along the length of the cam surface from the wall 224 to the free end 225. In this embodiment 220, the individual surfaces 226 and 228 have a generally circular cross section.

Each projection 222 and its associated cam surfaces 226 and 228 are symmetrical about a center plane 232 located midway between the top and bottom sides of the plate, The projections 222 extend into the passages, 220 sufficiently to reliably hold the contacts 218 in the passages.

Contacts 218 are inserted into passages 220 with a surface on the contact leg serving as a cam follower that is guided on a cam surface 226 or 228 to the end of the projection. The cam surfaces 226, 228 extend smoothly from wall 224 so that contact 218 does not bind or catch between projection 222 and wall 224 when the contact is inserted in the passage 220.

When the circuit members 212, 214 are brought toward assembly 210, the spring arms of the contacts 218 elastically bend and the upper and lower curved contact ends 234 contact upper and lower cam surfaces 226 and 228 as shown in FIG. 14. Convex surfaces 236 on the curved ends 234 serve as cam followers and are guided by the cam surfaces. The cam surfaces 226 and 228 slope at a first angle of about 10 degrees to the axis of the passage at a point where the cam followers 238 initially contact the cam surfaces. The cam followers 236 the slide along the cam surfaces 226, 228 towards the inner ends of projections 222. The curved ends 234 roll slightly on the cam surfaces and maintain the cam followers 236 in tangential engagement with the curved cam surfaces as the legs slide inwardly toward the free end of the projection.

FIG. 15 illustrates the assembly 210 when fully sandwiched between members 212 and 214 with the members held tightly against the assembly plate 216. The upper and lower cam followers 236 remain engaged with the cam surfaces with the cam followers 236 near projection inner end 225. The cam surfaces 229 and 228 slope at a second angle of about 6 degrees against the cam followers 266 as shown in FIG. 15.

The slope of the cam surfaces 226, 228 decreases with respect to the passage axis as the cam followers 236 slide inwardly from the position shown in FIG. 14 to the position shown in FIG. 15. By varying the slope of the cam surfaces 226 and 228 along the path of the cam followers 236, a steeper slope can be provided at the beginning of travel and a shallower slope at the end. The steeper initial slope angle enables the cam followers 236 to more firmly engage the projections when the spring forces are low. The slope then decreases as the contacts compress and the closure force increases. The decreasing slope continuously reduces the portion of the closure force that presses the cam followers, reduces the frictional force generated by the motion of the com followers and assures a low closing force to sandwich the assembly 210 between the circuit members.

When the circuit members 212, 214 move away from each other, the spring arms of the contacts 218 elastically bend away from each other and continue to press the contact noses against the contact pads. The cam followers 236 remain against the cam surfaces and slide on the cam surfaces away from the free ends at the centers of projections 222. The slope of the cam surfaces increases as the cam followers move away from the projection free ends so that the portion of the closure force that presses the cam followers against the cam surfaces increases. However, the closing force compressing the contacts decreases as the circuit members move apart and the contacts extend. This decreases the frictional forces generated by the sliding cam followers. As a result, the contact arms can extend towards the contact members without binding against the cam surfaces.

Although FIGS. 14 and 15 illustrate curved cam surfaces having a circular cross section, other interposer assembly embodiments of the present invention could have curved cam surfaces having other cross sections. Other embodiments may include cam surfaces having curved and planar surface portions. The change in slope along the cam surfaces can be greater than or less than that shown in the interposer assembly 210.

In all four embodiments, the projections are located in the center of the contact passages, obstruct the passages and are symmetrical to either side of a central plane that extends through the centers of the contact passages. As illustrated, each passage has a uniform transverse cross section, with the exception of the projections.

Each embodiment projection includes cam surfaces on both sides of the projection facing the upper and lower sides of the plate. The cam surfaces extend smoothly into the passages from the passage walls so that the contacts do not bind when inserted into the passages. The cam surfaces facilitate insertion of the contacts from either side of the plate.

Each embodiment contact is symmetrical to either side of the central portion of the contact. When the contact is fully inserted into a passage the cam follower on the contact which engaged the camming surface during insertion faces away from the camming surface on the projection in the passage. The inserted contact is loosely confined within the passage with the central portion of the metal contact overlying the free end of the projection and the contact free ends located between the free end of the projection and the side of the passage supporting the projection. The free ends are located within the thickness of the plate to assure that the contacts cannot slip past the projections and out the passages. The contacts can be sandwiched between the circuit members without capture of a free end on one side of the plate. When the contacts are fully collapsed between the circuit members, the central portion of the contact is centered on the plane of symmetry of the retention projections.

While we have illustrated and described preferred embodiments of our invention, it is understood that this is capable of modification, and we therefore do not wish to be limited to the precise details set forth, but desire to avail ourselves of such changes and alterations as fall within the purview of the following claims.

What is claimed is:

1. An interposer component adapted to receive a plurality of like metal contacts to form an interposer assembly for establishing electrical connections between pairs of opposed contact pads arranged in a pattern, the interposer component comprising:

a plate formed from a single piece of insulating material, the plate having a flat top surface, a flat bottom surface extending parallel to the top surface and a substantially uniform thickness;

a plurality of single contact passages extending through the thickness of the plate from the top surface to the bottom surface thereof, the passages spaced apart from each other and arranged in a pattern corresponding to the pattern of the pairs of spaced contact pad pairs;

each passage including opposed first and second passage ends, the first passage end comprising a first end wall, a pair of opposed walls joining the first end wall and extending to the second end, the walls extending generally perpendicularly to the top and bottom surfaces of the plate; and a plurality of projections integrally formed from the insulating material, each projection located in a passage and extending from the second end a distance into the passage to a projection end, the projection end spaced from the first end wall to define a narrowed passage portion therebetween so that the projection obstructs the passage mediate the top and bottom surfaces, each projection being symmetrical about a plane mediate the top and bottom surfaces and parallel thereto, each projection including first and second retention surfaces on opposite sides of the plane, the first retention surface sloping from the projection end towards the top surface of the plate and the second retention surface sloping from the projection end towards the bottom surface of the plate, each retention surface including a contact camming surface wherein contacts may be inserted into the passages from either the top surface or the bottom surface of the plate.

2. An interposer component as in claim 1 wherein the plane is located midway between the top and bottom surfaces of the plate.

3. An interposer component as in claim 1 wherein in each projection the retention surfaces extend from the projection end from the plane.

4. An interposer component as in claim 1 wherein each projection extends along a second end of a passage from the top surface of the plate to the bottom surface of the plate.

5. An interposer component as in claim 1 wherein said camming and retention surfaces are flat.

6. An interposer component as in claim 5 wherein said camming and retention surfaces slope at an angle not greater than 25 degrees to the axis of the passage.

7. An interposer component as in claim 1 wherein each camming surface extends from a second end of a passage to an end of a projection.

8. An interposer component as in claim 7 wherein said camming and retention surfaces are curved.

9. An interposer component as in claim 8 wherein said retention surfaces have a partially circular cross section.

10. An interposer component as in claim 9 wherein said camming surfaces slope at an angle of not greater than about 12 degrees to the axis of the passage.

11. An interposer component as in claim 1 wherein each retention surface extends smoothly from a second end of a passage whereby contacts may be inserted into the passages without binding on the projections.

12. An interposer component as in claim 11 wherein each retention surface extends from a second end of a passage at an angle not greater than 25 degrees with respect to the axis of the passage.

13. An interposer component as in claim 1 wherein each projection is spaced inwardly from the top and bottom surfaces of the plate at a second end of a passage.

14. An interposer component as in claim 13 wherein each projection is spaced inwardly about 0.005 inches from each of the top and bottom surfaces of the projection at a second end of a passage.

15. An interposer assembly including the interposer component as in claim 1 and a plurality of metal contacts, a single contact disposed in each passage in the interposer component;

each of said metal contacts including a central portion defining a plane of symmetry, a pair of flexible spring members joining the central portion on opposite sides of the plane and having outer ends, a pair of contact noses located on the outer ends, and a pair of cam followers on the legs and facing a contact camming surface on the projection in the passage in which the contact is disposed, the projection in each passage located between the legs of the contact in the passage, the central portion engaging the first end wall, the contact noses normally spaced a distance apart greater than the thickness of the plate;

wherein upon insertion of each contact into a passage towards a camming surface a leg engages the cam surface, is cammed past the projection and snaps back behind the projection; and wherein upon sandwiching the interposer assembly between opposed pairs of contact pads, the cam followers of each contact engage the camming surfaces and slide on the camming surfaces towards the free end of the projection.

16. An interposer component as in claim 15 wherein the plane of symmetry of each contact is substantially coplanar with the plane of symmetry of the plate when the interposer assembly is sandwiched between opposed pairs of contact pads.

17. An interposer component as in claim 16 wherein the outer ends of the spring members of each contact are located within the thickness of the plate when the contacts are supported by gravity against retention surfaces.

18. An interposer component adapted to receive a plurality of like compressible metal contacts to form an interposer assembly for establishing electrical connections between pairs of opposed contact pads arranged in a pattern, the interposer component comprising:

a plate formed from a single piece of insulating material, the plate having a flat top surface, a flat bottom surface extending parallel to the top surface and a substantially uniform thickness;

a plurality of single contact passages extending through the thickness of the plate from the top surface to the bottom surface thereof, the passages spaced apart from each other and arranged in a pattern corresponding to the pattern of the pairs of spaced contact pad pairs;

each passage including opposed first and second passage ends, the first passage end comprising a first end wall, a pair of opposed walls joining the first end wall and extending to the second end, the walls extending generally perpendicularly to the top and bottom surfaces of the plate; and a plurality of projections integrally formed from the insulating material, each projection located in a passage and extending from the second end a distance into the passage to a projection end, the projection end spaced from the first end wall to define a narrowed passage portion therebetween so that the projection obstructs the passage mediate the top and bottom surfaces, each projection including first and second retention surfaces on opposite sides of the projection, the first retention surface sloping from the projection end towards the top surface of the plate and the second retention surface extending from the projection end towards the bottom surface of the plate, each retention surface including a contact camming surface wherein contacts engage both camming surfaces when the contacts are compressed between opposite pairs of contact pads.

19. An interposer component as in claim 18 wherein each projection is symmetrical about a plane of symmetry parallel to and between the top and bottom surfaces of the plate.

20. An interposer component as in claim 18 wherein each camming surface slopes at an angle not more than 25 degrees with respect to the axis of the passage.

21. An interposer component as in claim 18 wherein the camming surfaces are flat.

22. An interposer component as in claim 18 wherein the camming surfaces are curved.

23. An interposer component as in claim 18 wherein in each projection one of the camming surfaces engages a contact and cams the contact towards the free end of the projection when a contact is inserted in a passage.

24. An interposer component as in claim 23 wherein contacts may be inserted into the passages from either the top surface or the bottom surface of the plate.

25. An interposer component as in claim 24 wherein in each projection the camming surfaces extend to the free end of the projection.

26. A contact housing adapted to receive a plurality of like metal contacts to form an interposer assembly for establishing electrical connections between pairs of opposed contact pads arranged in a pattern, the contact housing comprising:

a one-piece integral body formed from insulating material, the body having first and second surfaces separated by the thickness of the body;

a plurality of individual contact passages extending through the thickness of the body and opening at the first and second surfaces of the body;

a contact retainer projecting into each passage to a free end, each retainer symmetrical about a plane located between the first and second surfaces of the body;

first and second retainer surfaces on each retainer and located on opposite sides of the plane, the first retainer surface sloping from the free end of the retainer towards the first surface of the body and the second retainer surface sloping from the free end of the retainer towards the second surface of the body; and each retention surface including a contact camming surface wherein a contact engages both camming surfaces when the contact is operatively connected between a pair of contact pads.

27. A contact housing as in claim 26 wherein each contact retainer is centered between the first and second surfaces of the body.

28. A contact housing as in claim 27 wherein each retainer extends from the first surface of the body to the second surface of the body.

29. A contact housing as in claim 27 wherein each retainer is recessed inwardly from the first and second body surfaces.

30. A contact housing as in claim 27 wherein each retention surface slopes at an angle not greater than 25 degrees with respect to the axis of a passage.

31. A contact housing as in claim 30 wherein each retention surface is a planar surface.

32. A contact housing as in claim 30 wherein each camming surface has a variable slope with respect to the axis of a passage.

33. An interposer assembly including the contact housing as in claim 27 and a plurality of metal contacts, a single contact disposed in each passage of the contact housing; each contact having a pair of free ends located on opposite sides of a contact retainer; and the free ends located within the thickness of the contact housing when the contact is held against gravity on the contact retainer.

34. An interposer assembly as in claim 33 wherein each contact includes a cam follower surface that engages a contact retainer and slides on a retention surface to the free end of the retainer when the contact is inserted in the passage.

* * * * *